United States Patent
Kirai et al.

(10) Patent No.: US 12,394,955 B2
(45) Date of Patent: Aug. 19, 2025

(54) SEMICONDUCTOR LIGHT-EMITTING DEVICE, AND WATER DISINFECTION DEVICE

(71) Applicant: STANLEY ELECTRIC CO., LTD., Tokyo (JP)

(72) Inventors: Shogo Kirai, Tokyo (JP); Takayoshi Yamane, Tokyo (JP); Chizu Saito, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 473 days.

(21) Appl. No.: 18/009,559

(22) PCT Filed: May 20, 2021

(86) PCT No.: PCT/JP2021/019263
§ 371 (c)(1),
(2) Date: Dec. 9, 2022

(87) PCT Pub. No.: WO2021/251102
PCT Pub. Date: Dec. 16, 2021

(65) Prior Publication Data
US 2023/0223736 A1    Jul. 13, 2023

(30) Foreign Application Priority Data
Jun. 9, 2020    (JP) .................... 2020-100398

(51) Int. Cl.
*H01S 5/02*    (2006.01)
*C02F 1/32*    (2023.01)
(Continued)

(52) U.S. Cl.
CPC .......... *H01S 5/02208* (2013.01); *C02F 1/325* (2013.01); *H01S 5/0237* (2021.01);
(Continued)

(58) Field of Classification Search
CPC .... H01S 5/02208; H01S 5/0237; C02F 1/325; C02F 2201/3222; C02F 2303/04; H10H 20/8506
See application file for complete search history.

(56) References Cited

U.S. PATENT DOCUMENTS 7,235,876 B2    6/2007    Okumura et al.
10,183,360 B2    1/2019    Nagatomo et al.
(Continued)

FOREIGN PATENT DOCUMENTS

JP    2006093372 A    4/2006
JP    2007103909 A    4/2007
(Continued)

OTHER PUBLICATIONS

International Preliminary Report on Patentability (IPRP) (and English language translation thereof) dated Dec. 22, 2022, issued in International Application No. PCT/JP2021/019263.
(Continued)

*Primary Examiner* — Sean M Luck
(74) *Attorney, Agent, or Firm* — Holtz, Holtz & Volek PC

(57) ABSTRACT

A semiconductor light-emitting device includes a first bonding pattern made of metal that is formed on a substrate, and a second bonding pattern provided in a base portion and a flange portion of a dome-shaped transparent body. The first and second bonding patterns are bonded to each other via solder, to seal a space in a convex lid portion. The first and second bonding patterns have rectangular ring shapes that surround the semiconductor light-emitting element when viewed from above, at least edges on inner peripheral sides of corner portions thereof are positioned on outer sides of outer peripheral edges of an annular base portion of the convex lid portion, and edges on inner peripheral sides of straight-line portions sandwiched between the corner portions are positioned closer to the semiconductor light-emit-
(Continued)

ting element than the outer peripheral edge of the annular base portion of the convex lid portion.

13 Claims, 16 Drawing Sheets

(51) Int. Cl.
*H01S 5/02208* (2021.01)
*H01S 5/0237* (2021.01)
*H10H 20/85* (2025.01)

(52) U.S. Cl.
CPC .. *C02F 2201/3222* (2013.01); *C02F 2303/04* (2013.01); *H10H 20/8506* (2025.01)

(56) References Cited

U.S. PATENT DOCUMENTS

| | | | |
|---|---|---|---|
| 10,658,550 B2 * | 5/2020 | Shi | ........................ H10H 20/856 |
| 2017/0162767 A1 | 6/2017 | Lu et al. | |
| 2017/0279019 A1 | 9/2017 | Ueda et al. | |
| 2017/0338388 A1 | 11/2017 | Wu et al. | |
| 2018/0086649 A1 | 3/2018 | Hayashi et al. | |
| 2019/0189862 A1 | 6/2019 | Ichinokura et al. | |
| 2021/0226105 A1 | 7/2021 | Fujinoki et al. | |
| 2022/0115570 A1 | 4/2022 | Fujinoki et al. | |

FOREIGN PATENT DOCUMENTS

| | | |
|---|---|---|
| JP | 2015018873 A | 1/2015 |
| JP | 2015073027 A | 4/2015 |
| JP | 5838357 B1 | 11/2015 |
| JP | 2016127255 A | 7/2016 |
| JP | 2017216389 A | 12/2017 |
| JP | 2018037581 A | 3/2018 |
| JP | 2018509290 A | 4/2018 |

OTHER PUBLICATIONS

Extended European Search Report (EESR) dated Jul. 25, 2024, issued in counterpart European Application No. 21822043.2.
International Search Report (ISR) (and English language translation thereof) dated Jul. 20, 2021, issued in International Application No. PCT/JP2021/019263.
Written Opinion dated Jul. 20, 2021, issued in International Application No. PCT/JP2021/01926.

* cited by examiner

FIG. 1(a)
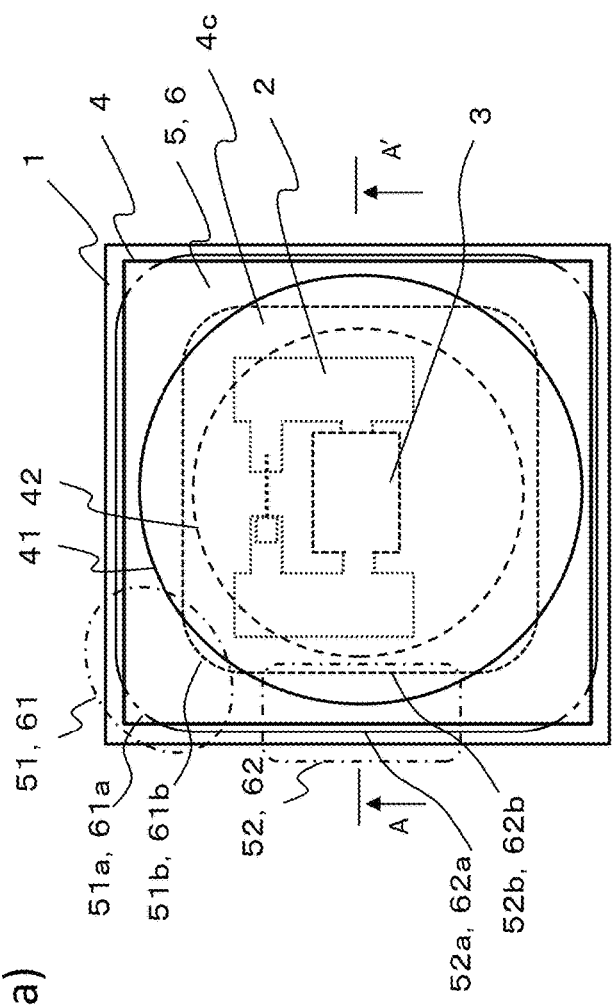
FIG. 1(b) CROSS-SECTIONAL VIEW TAKEN ALONG LINE A-A'
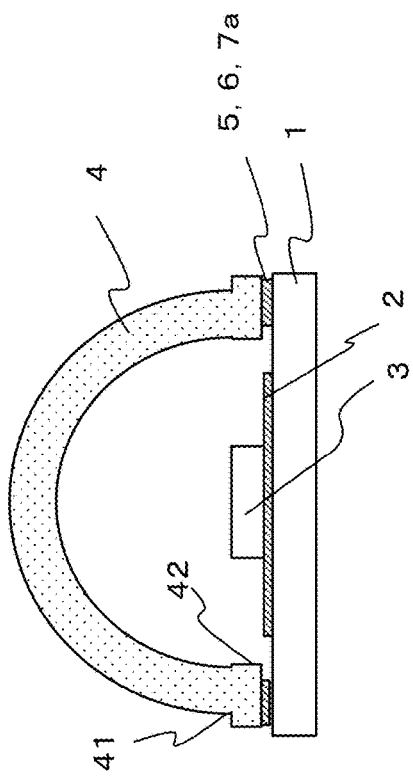

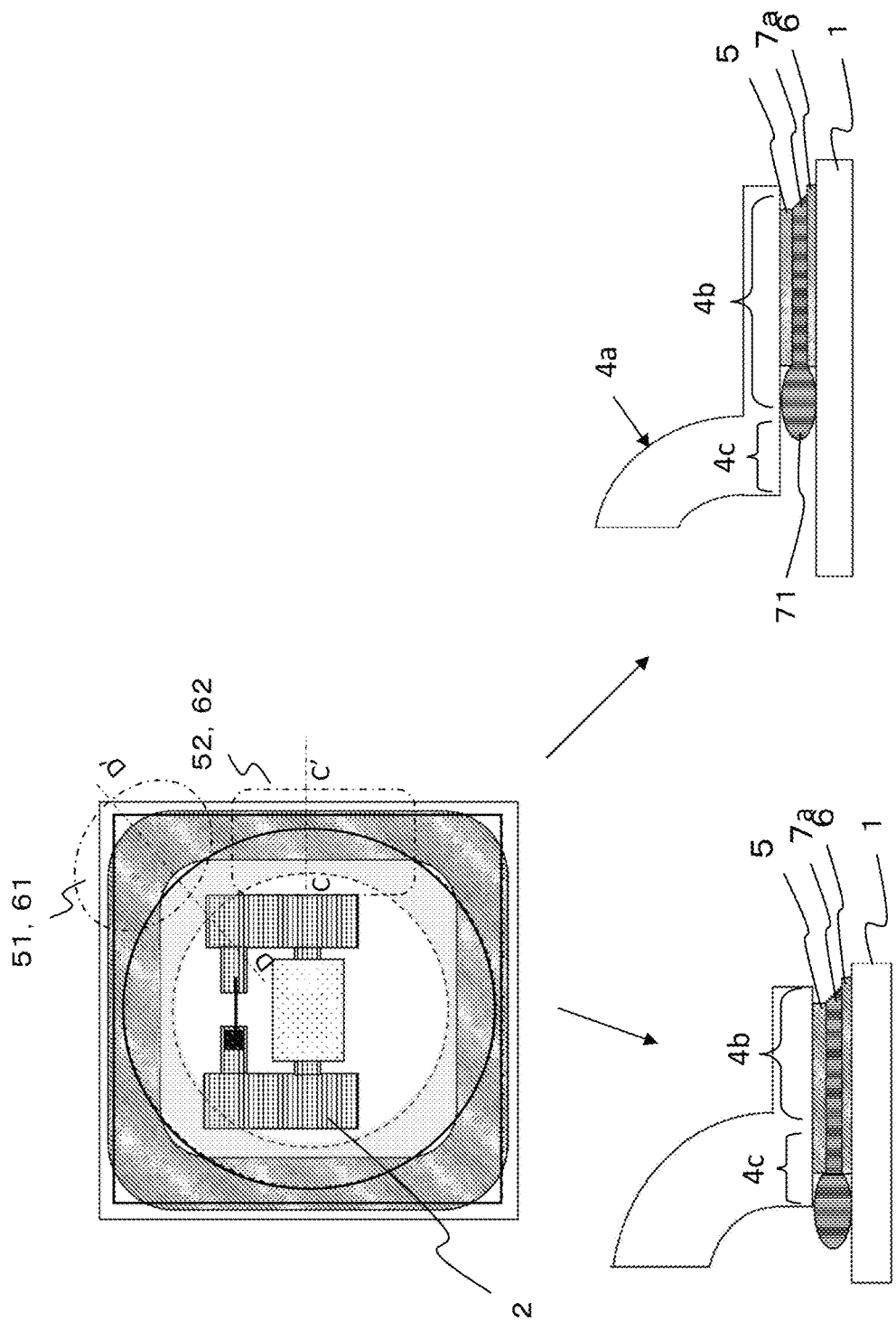

CROSS-SECTIONAL VIEW TAKEN ALONG LINE F-F'

CROSS-SECTIONAL VIEW
TAKEN ALONG LINE G-G'

SEMICONDUCTOR LIGHT-EMITTING DEVICE, AND WATER DISINFECTION DEVICE

TECHNICAL FIELD

The present invention relates to a semiconductor light-emitting device in which a space around a semiconductor light-emitting element is sealed airtightly.

BACKGROUND ART

In the related art, for example, an airtight package in a semiconductor light-emitting device that requires airtightness uses a structure in which a flat plate-shaped translucent optical element is bonded to a cavity-type substrate as disclosed in PTL 1, or a structure in which a cavity-type translucent optical element is bonded to a flat plate-shaped substrate as disclosed in PTL 2. For example, an optical element such as glass and a heat dissipation substrate such as a ceramic substrate are bonded to each other and sealed by solder such as AuSn or a brazing material.

In addition, in an airtight package as described above, when a translucent optical element is bonded to a substrate by using solder, there is a problem that the solder protrudes outside a bonding pattern. PTL 3 suggests a structure of suppressing protrusion of solder from a bonding pattern by forming a film such as an oxide film that has poor solder wettability in an inner peripheral portion and an outer peripheral portion of a bonding area. In addition, PTL 4 suggests a structure in which a recessed structure is formed on a substrate and protruding solder is accommodated in a recessed portion to suppress wetting and spreading of the solder outside of the recessed portion.

CITATION LIST

Patent Literature

PTL 1: JP2015-18873A
PTL 2: JP5838357B
PTL 3: JP2015-073027A
PTL 4: JP2007-103909A

SUMMARY OF INVENTION

Technical Problem

In an airtight package, a configuration of suppressing a problem that solder melted when an optical element and a heat dissipation substrate are bonded to each other protrudes from a bonding pattern by forming an oxide film or a groove in advance on a substrate as disclosed in PTLS 3 and 4 leads to increase costs.

An object of the invention is to newly provide a semiconductor light-emitting device having high airtight reliability by increasing bonding reliability between a substrate and a lid.

Solution to Problem

In order to achieve the object, a semiconductor light-emitting device according to the invention includes a substrate; a semiconductor light-emitting element that is mounted on the substrate; and a dome-shaped transparent body that is mounted on the substrate. The dome-shaped transparent body includes a convex lid portion that covers a space around the semiconductor light-emitting element and includes an annular base portion and a flange portion that projects to an outer side of an outer peripheral edge of the annular base portion. A first bonding pattern made of metal that surrounds the semiconductor light-emitting element is formed on the substrate. A second bonding pattern having a shape corresponding to the first bonding pattern is provided in the base portion and the flange portion of the dome-shaped transparent body. The first bonding pattern and the second bonding pattern are bonded to each other via solder, to seal the space in the convex lid portion. The first bonding pattern and the second bonding pattern have rectangular ring shapes that surround the semiconductor light-emitting element when viewed from above, at least edges on inner peripheral sides of corner portions thereof are positioned on outer sides of outer peripheral edges of the annular base portion of the convex lid portion, and at least edges on inner peripheral sides of straight-line portions sandwiched between the corner portions are positioned closer to the semiconductor light-emitting element than the outer peripheral edge of the annular base portion of the convex lid portion.

Advantageous Effects of Invention

According to the invention, a bonding pattern between a substrate and a dome-shaped transparent body has a rectangular ring shape when viewed from above, corner portions thereof are positioned on outer sides of an annular base portion of a convex lid portion to which a load is applied when a dome-shaped transparent body is pressed at the time of bonding, and thus it is possible to provide a semiconductor light-emitting device in which generation of voids in a bonding portion is suppressed, bonding reliability is high, and airtight reliability is high.

BRIEF DESCRIPTION OF DRAWINGS

FIG. 1(a) is a top view of a semiconductor light-emitting device according to Embodiment 1 and FIG. 1(b) is a cross-sectional view thereof taken along the line A-A'.

FIG. 7(a) is a cross-sectional view of a state in which the solder 7 wets and spreads to the bonding pattern in the bonding process of the semiconductor light-emitting device according to Embodiment 1, taken along the line C-C', and FIG. 7(b) is a cross-sectional view thereof taken along the line D-D'.

DESCRIPTION OF EMBODIMENTS

Hereinafter, a semiconductor light-emitting device according to an embodiment of the invention is described.

Embodiment 1

A configuration of a semiconductor light-emitting device according to Embodiment 1 is described with reference to FIG. 1 to FIG. 7.

A top view and a cross-sectional view of the semiconductor light-emitting device according to Embodiment 1 are illustrated in FIGS. 1(a) and 1(b).

The semiconductor light-emitting device according to Embodiment 1 includes a substrate 1, a semiconductor light-emitting element 3 mounted on an electrode 2 on the substrate 1, and a dome-shaped transparent body 4 mounted on the substrate 1.

Figure 2B:
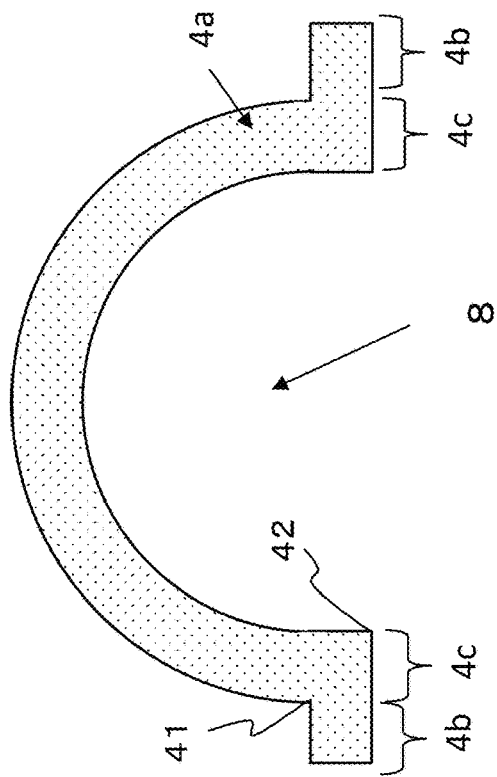
FIG. 2(a) is a top view of a dome-shaped transparent body 4 of the semiconductor light-emitting device according to Embodiment 1 and FIG. 2(b) is a cross-sectional view thereof.
Figure 2A:
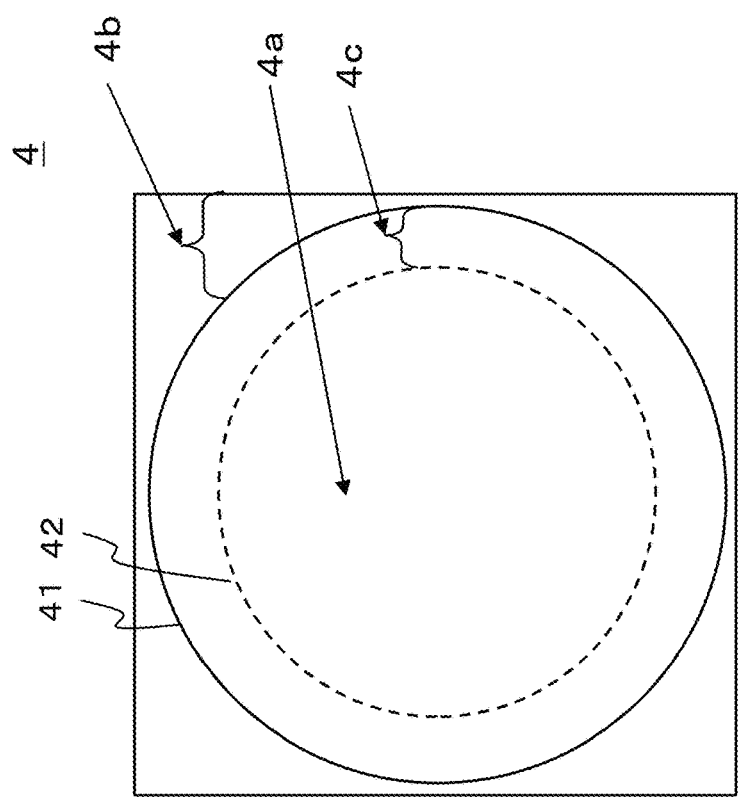

As illustrated in a top view and a cross-sectional view of FIGS. 2(a) and 2(b), the dome-shaped transparent body 4 covers a space around the semiconductor light-emitting element 3 and includes a convex lid portion 4a including an annular base portion 4c and a flange portion 4b projecting to an outer side of an outer peripheral edge of the annular base portion 4c. According to the present embodiment, the base portion 4c has an annular shape with a predetermined width. As illustrated in FIGS. 2(a) and 2(b), the base portion 4c is a root portion of the convex lid portion 4a that configures a bottom surface with a thickness of the convex lid portion 4a, in the dome-shaped transparent body 4.

According to the present embodiment, both the substrate 1 and the flange portion 4b have rectangular shapes when viewed from above, and the dome-shaped transparent body 4 is mounted on the substrate 1 so that directions of corner portions are the same. The size of the flange portion 4b is slightly smaller than that of the substrate 1 in the present embodiment.

Figure 3:
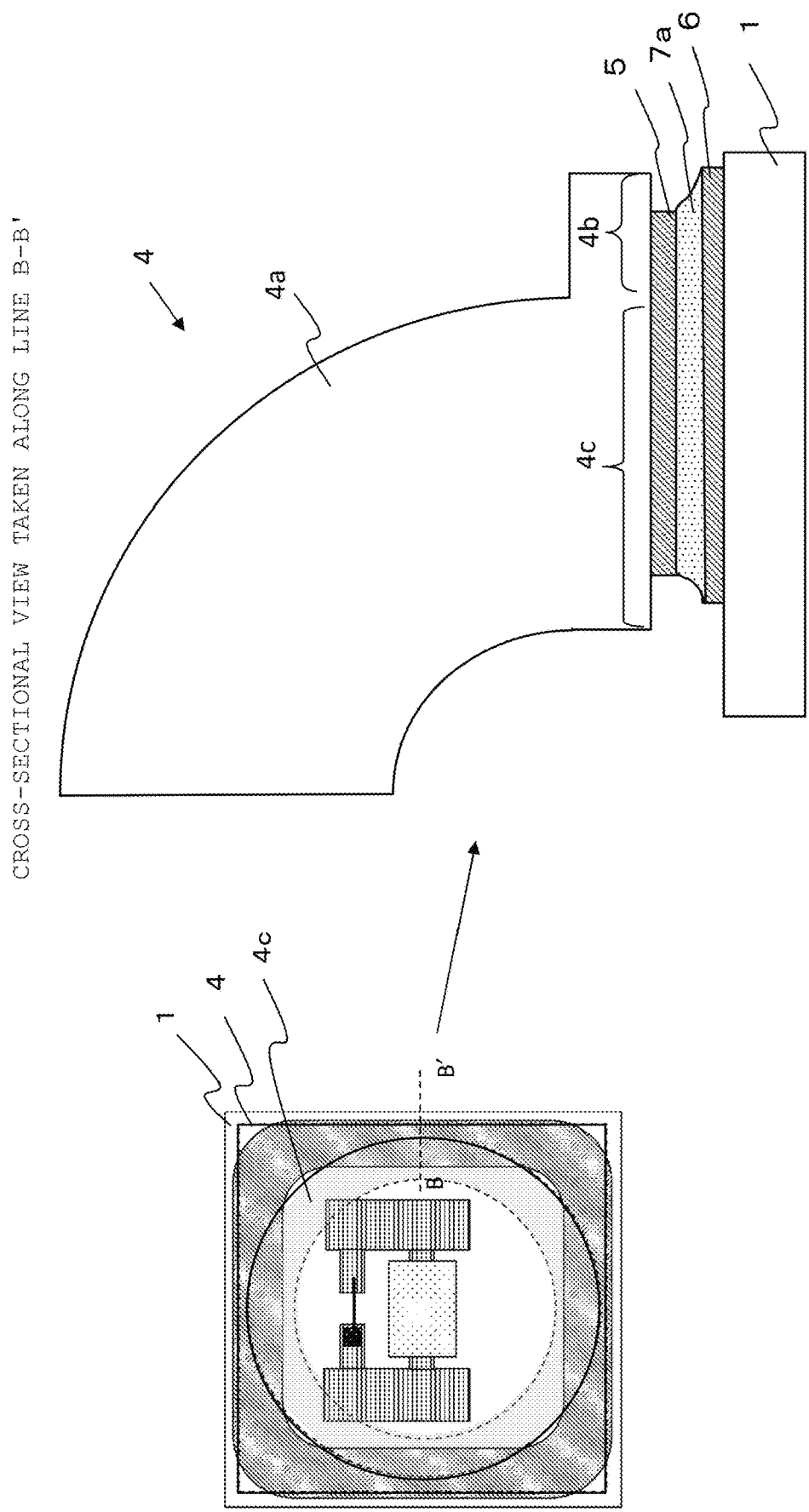
FIG. 3 is a cross-sectional view of the semiconductor light-emitting device according to Embodiment 1 taken along the line B-B'.

As illustrated in an enlarged cross-sectional view of FIG. 3, the annular base portion 4c and the flange portion 4b of the dome-shaped transparent body 4, and the substrate 1 in contact with the annular base portion 4c and the flange portion 4b are respectively provided with the bonding patterns 5 and 6 having corresponding shapes. The bonding patterns 5 and 6 are provided along the rectangular appearances of the flange portion 4b and the substrate 1.

Figure 4A:
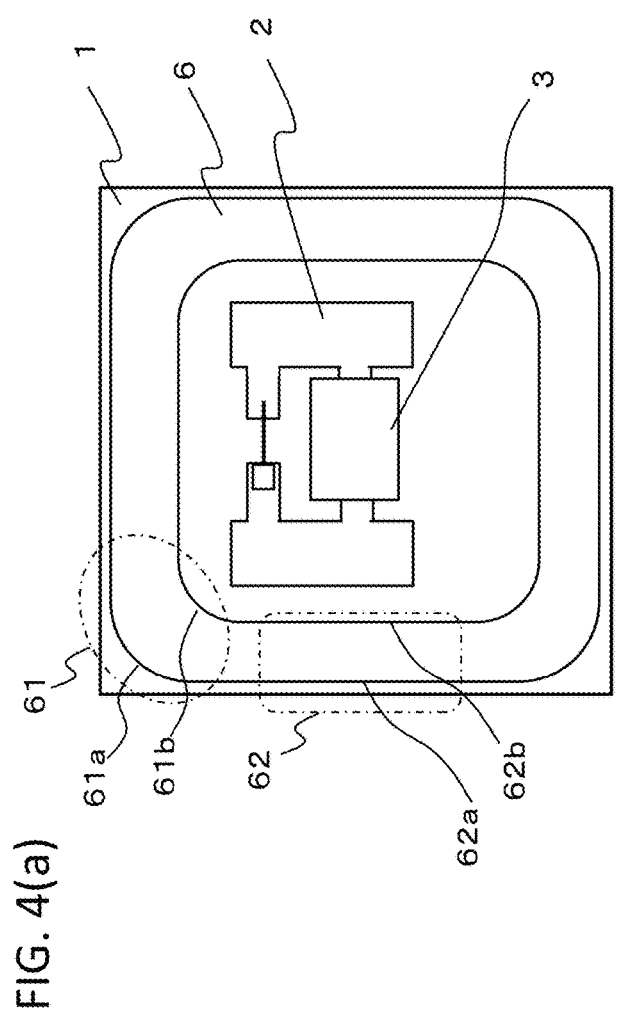
FIG. 4(a) is a top view of a substrate 1 of the semiconductor light-emitting device according to Embodiment 1.
Figure 4B:
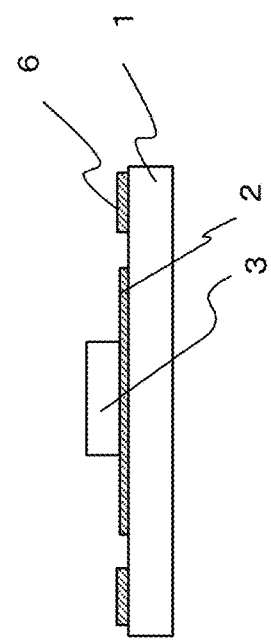
FIG. 4(b) is a cross-sectional view thereof.
Figure 5A:
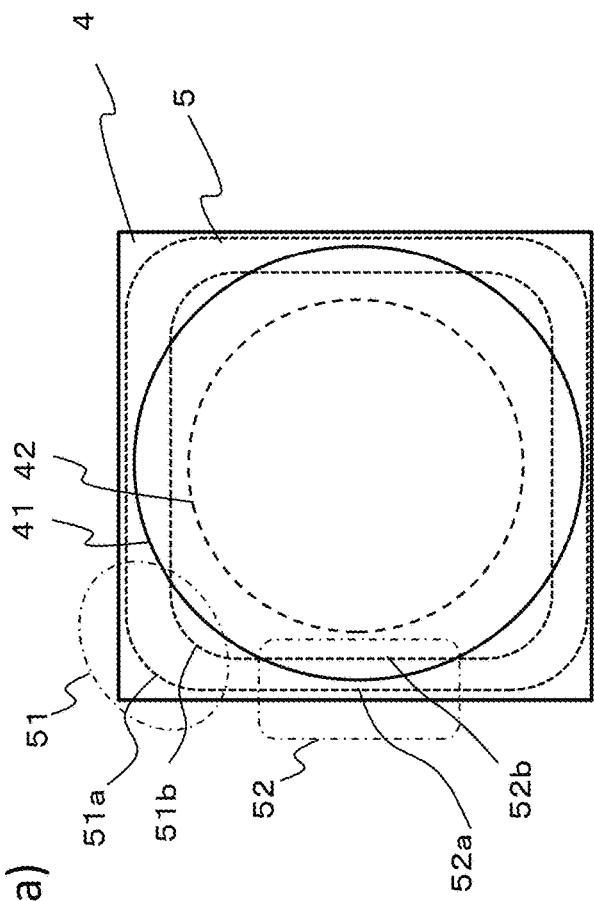
FIG. 5(a) is a top view of a state in which a bonding pattern 5 of the dome-shaped transparent body 4 of the semiconductor light-emitting device according to Embodiment 1 is provided.
Figure 5B:
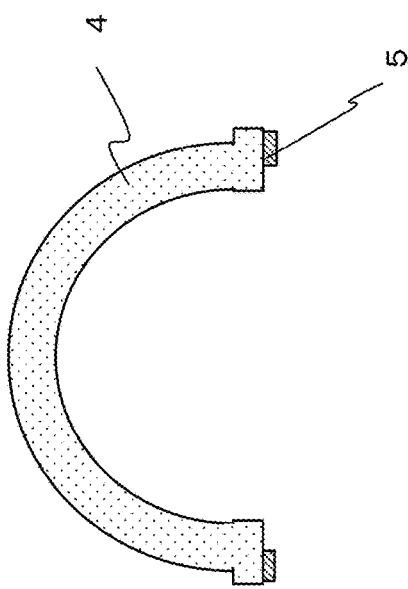
FIG. 5(b) is a cross-sectional view thereof.

A top view and a cross-sectional view of the substrate 1 in which the bonding pattern 6 is provided are illustrated in FIGS. 4(a) and 4(b). In addition, a top view and a cross-sectional view of the dome-shaped transparent body 4 in which the bonding pattern 5 is provided are illustrated in FIGS. 5(a) and 5(b). As seen from FIG. 4(a), FIG. 5(a), and FIGS. 1(a) and 1(b), when viewed from above, the bonding patterns 5 and 6 are formed with a predetermined width so as to surround the semiconductor light-emitting element 3, and have rectangular ring shapes.

The bonding pattern 5 provided in the dome-shaped transparent body 4 includes four straight-line portions 52 formed along the sides that configure the outer shape of the dome-shaped transparent body 4 and corner portions 51 that connect between the adjacent straight-line portions 52.

The bonding pattern 6 provided on the substrate 1 includes four straight-line portions 62 formed along the sides that configure the outer shape of the substrate 1 and corner portions 61 that connect the adjacent straight-line portions 62.

The bonding patterns 5 and 6 are bonded to each other via the solder 7, to form a bonding layer 7a (see FIG. 3). Accordingly, a space 8 in the convex lid portion 4 is sealed. The bonding layer 7a wets and spreads along the bonding pattern and has a fillet shape as a whole end portion. In addition, the terminal end portion may have a slightly raised shape due to the action of surface tension. In addition, the solder 7 may be in contact with the side surface of the bonding pattern 5.

The width of the bonding pattern 5 on a transparent body 4 side is preferably narrower than the width of the bonding pattern 6 on a substrate 1 side.

Here, the corner portions 51 and 61 of the bonding patterns 5 and 6 having the rectangular ring shapes are configured so that edges 51a and 61a on an outer peripheral side are at least positioned on an outer side of an outer peripheral edge 41 of the annular base portion 4c of the convex lid portion 4a (see FIG. 1(a)). In addition, edges 51b and 61b on an inner peripheral side of the corner portions 51 and 61 of the bonding patterns 5 and 6 are also preferably positioned on the outer side of the outer peripheral edge 41 of the annular base portion 4c of the convex lid portion 4a.

Accordingly, the bonding pattern 5 provided in the dome-shaped transparent body 4 is provided so that the straight-line portion 52 partially overlaps with the base portion 4c, and at least a part of the corner portion 51 is provided to be positioned on an outer side of the base portion 4c. That is, an area that does not overlap with the base portion 4c is provided in the corner portion 51.

Meanwhile, the straight-line portions 52 and 62 of the bonding patterns 5 and 6 with the rectangular ring shape are configured so that edges 52b and 62b on the inner peripheral side are at least positioned on the semiconductor light-emitting element 3 side of the outer peripheral edge 41 of the annular base portion 4c of the convex lid portion 4a (see FIG. 1(a)). In addition, edges 52a and 62a on the outer peripheral side of the straight-line portions 52 and 62 of the bonding patterns 5 and 6 with the rectangular ring shape are preferably positioned on the outer side of the outer peripheral edge 41 of the base portion 4c.

Accordingly, the bonding pattern 6 provided on the substrate 1 is provided so that the straight-line portion 62 partially overlaps with the base portion 4c, and at least a part of the corner portion 61 is provided to be positioned on the outer side of the base portion 4c. That is, an area that does not overlap with the base portion 4c is provided in the corner portion 61.

In this manner, the semiconductor light-emitting device according to the present embodiment uses the bonding patterns 5 and 6 with the rectangular ring shape and is configured so that the corner portions 51 and 61 thereof are positioned on the outer side of the outer peripheral edge 41 of the annular base portion 4c to which a load is most applied, the load being applied to the convex lid portion 4a when the dome-shaped transparent body 4 is bonded. Meanwhile, the straight-line portions 52 and 62 of the bonding patterns 5 and 6 are configured so that at least a part thereof is positioned under the base portion 4c to which a load is most applied. Accordingly, in the bonding process, the loads applied to the corner portions 51 and 61 of the bonding patterns 5 and 6 are smaller than the loads applied to the straight-line portions 52 and 62.

Accordingly, in a manufacturing process, when the substrate 1 is heated while a load is applied in a direction of pressing the dome-shaped transparent body 4 to the substrate 1, the solder 7 disposed between the bonding patterns 5 and 6 starts to melt from an area sandwiched between the straight-line portions 52 and 62 to which a load is most applied (more specifically, an area where the base portion 4c overlaps in a thickness direction). At the time of the melting start, the solder 7 in an area sandwiched between the corner portions 51 and 61 (an area where the base portion 4c does not overlap in the thickness direction) is not melted but is melted thereafter. Accordingly, as illustrated in FIG. 6(a), the melting direction of the solder 7 can be directed from a center of the straight-line portions 52 and 62 to the corner portions 51 and 61. That is, the bonding progress direction can be directed from the center of the straight-line portions 52 and 62 to the corner portions 51 and 61.

In the semiconductor light-emitting device according to the present embodiment, the bonding progresses together with the melting of the solder 7 from the straight-line portions 52 and 62 of the bonding patterns 5 and 6 toward the corner portions 51 and 61, and the bonding progresses so that voids are pushed out toward the corner portions 51 and 61, even when voids are generated at the time of melting. Therefore, the voids are less likely to be involved and less likely to remain after cooling.

In this manner, in the device according to the present embodiment, the bonding layer 7a settled by the solder 7 can be formed, and also generation of voids that connect the space 8 inside the dome-shaped transparent body 4 to an outside space can be suppressed. Accordingly, it is possible to provide the semiconductor light-emitting device having high airtightness.

In addition, the bonding patterns 5 and 6 can be formed with any metal, for example, among Ni, Cr, Au, Cu, Pt, Ti, Pd, and W, and can be formed with a stacked body of layers made of two or more kinds of metal among the above metal.

As the solder 7, for example, AuSn solder can be used. The form of the solder at the time of supplying the solder in the manufacturing process may be a sheet shape or may be a dot shape.

As the semiconductor light-emitting element 3, a light emitting diode (LED) and a laser light emitting diode (including a surface emitting laser) can be used. As the semiconductor light-emitting element 3, a semiconductor light-emitting element having an appropriate light emission wavelength according to the use of the semiconductor light-emitting device and emitting ultraviolet light, visible light, or infrared light can be selected. The dome-shaped transparent body 4 is configured with a material that transmits light emitted from the semiconductor light-emitting element 3.

For example, as the semiconductor light-emitting element 3, an element that emits ultraviolet light having a wavelength band of 210 nm or more and 310 nm or less can be used.

In this case, for the dome-shaped transparent body 4, one in which at least the convex lid portion 4a is configured with a material (for example, quartz, borosilicate glass, and sapphire glass) that transmits deep ultraviolet rays can be used.

The semiconductor light-emitting element 3 is configured with a compound semiconductor and at least includes a p-type semiconductor layer, a light-emitting layer, and an n-type semiconductor layer. In addition, as a light emitting diode that emits ultraviolet light having a wavelength of 200 nm to 405 nm, an aluminum nitride-based, gallium nitride-based, or aluminum gallium nitride-based semiconductor light-emitting element can be used.

The semiconductor light-emitting element 3 is mounted on the electrode 2 formed on the substrate 1, with an appropriate bonding material. According to the present embodiment, the semiconductor light-emitting element 3 is mounted with an AuSn bonding material.

The semiconductor light-emitting element 3 can be mounted on the electrode 2 via a submount substrate (not illustrated). In addition, the number of elements mounted on one substrate may not be one. The substrate 1 is not limited to a flat plate shape as in the present embodiment and can be a shape including a recessed portion at a position where the semiconductor light-emitting element 3 is mounted.

Aluminum nitride (AlN) which is a base material that can maintain airtightness can be used as the substrate 1. As the base material, ceramics made of nitrides, carbides, or oxides such as silicon nitride ($Si_3N_4$), silicon carbide (SiC), and aluminum oxide ($Al_2O_3$) can be used in addition to aluminum nitride (AlN). The substrate 1 may be a high-temperature fired ceramic substrate or a low-temperature fired ceramic substrate. By using the substrate 1 of a ceramic base material, since heat generated by the semiconductor light-emitting element 3 can be effectively dissipated, and also the semiconductor light-emitting element 3 has ultraviolet resistance, even when the semiconductor light-emitting element 3 emits ultraviolet light, light output can be maintained for a long period of time.

The semiconductor light-emitting element 3 is mounted on the electrode 2 formed on the substrate 1. The electrode 2 is formed in connection with a back surface electrode (not illustrated) that is electrically connected to the semiconductor light-emitting element and formed on the back surface of the substrate 1 and a through electrode that is formed to penetrate the substrate 1, for electric supply from the outside to the semiconductor light-emitting element 3. In addition to the semiconductor light-emitting element 3, other electronic components such as Zener diodes and photodiodes can be mounted on the electrode 2 depending on the application.

A material that reduces a refractive index difference between the semiconductor light-emitting element 3 and the dome-shaped transparent body 4 may be disposed in a hollow portion 8.

On the front surface of the bottom surface (the surfaces of the flange portion 4b and the base portion 4c on the substrate 1 side) of the dome-shaped transparent body 4, fine irregularities, that is, coarseness, can be formed. Due to the coarseness of the bottom surface of the transparent body 4, the outer side of a lens is slightly curved, and thus at the time of bonding, the bonding can progress in a direction from the inner side to the outer side, and thus it is possible to provide the semiconductor light-emitting device with higher bonding stability. In order to avoid defective bonding caused by an excessively large warpage amount, it is preferable to set the coarseness amount so that the warpage amount (height difference between the inner side and the outer side of the bottom surface of the dome-shaped transparent body 4) is smaller than the thickness of the bonding pattern 6 on the substrate side.

Manufacturing Method

An example of a method of manufacturing the semiconductor light-emitting device according to the present embodiment is described.

Figure 8:
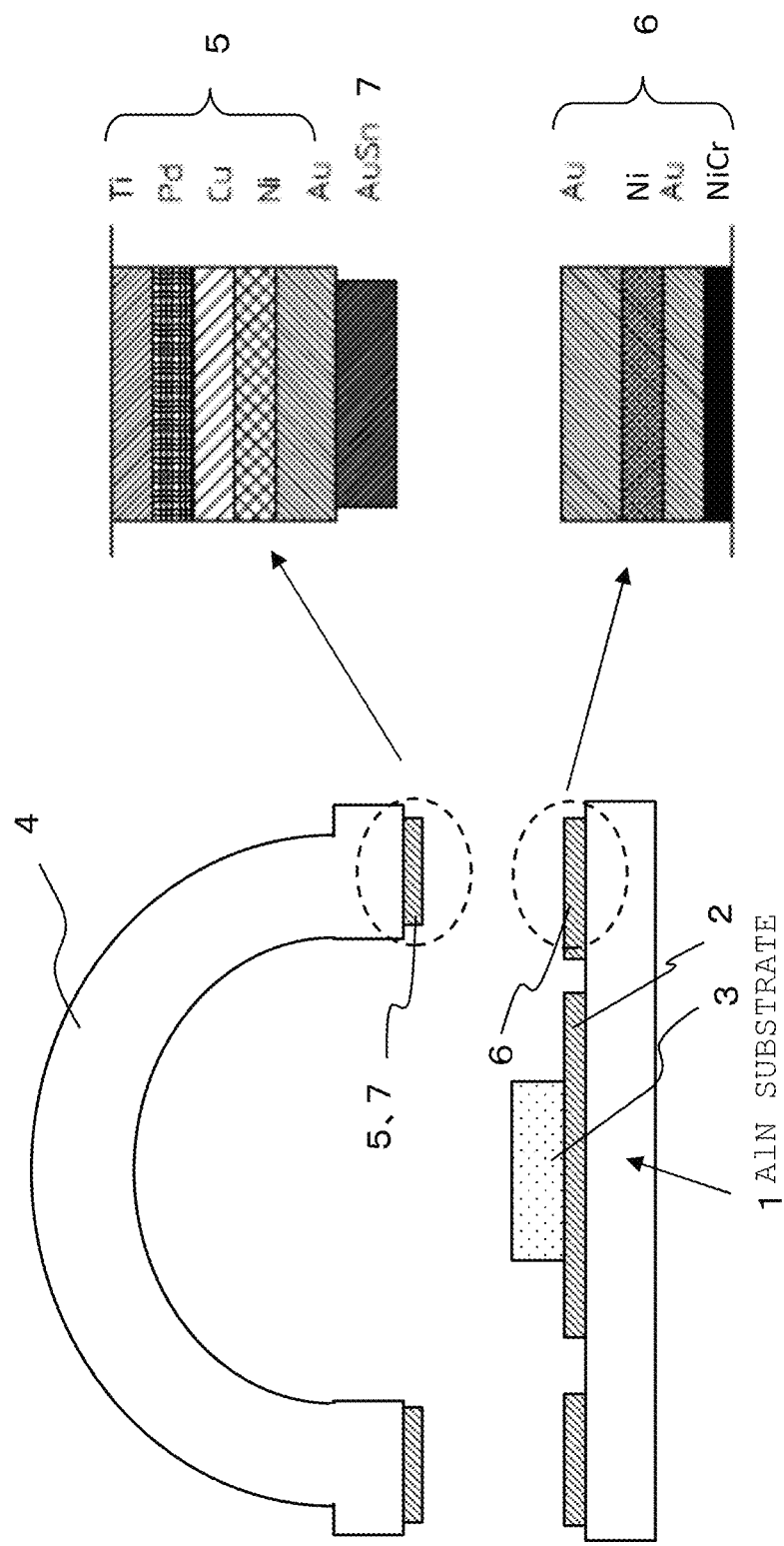
FIG. 8 is a cross-sectional view illustrating an example of layer structures of bonding patterns 5 and 6 of the semiconductor light-emitting device according to Embodiment 1.

For example, the substrate 1 made of AlN is prepared, and the bonding pattern 6 having the rectangular ring shape and the electrode 2 as described above are formed. For example, as illustrated in FIG. 8, the layer structure of the bonding pattern 6 is a structure obtained by sequentially stacking a NiCr layer, an Au layer, a Ni layer, and an Au layer in order from the substrate 1 side. The uppermost layer of the bonding pattern 6 is preferably made of a material that is melted at the time of bonding and mixed with the melted solder 7 to change the composition of the solder 7, so that a eutectic bonding layer with a melting point higher than the solder 7 can be formed. For example, when AuSn of the solder 7 is used, the uppermost layer of the bonding pattern 6 is preferably an Au layer.

Meanwhile, the dome-shaped transparent body 4 made of quartz glass is prepared, and the bonding pattern 5 having the rectangular ring shape as described above is formed on the base portion 4c and the flange portion 4b. For example, as illustrated in FIG. 8, the layer structure of the bonding pattern 5 is a structure obtained by stacking a Ti layer, a Pd layer, a Cu layer, a Ni layer, and an Au layer in order from a dome-shaped transparent body 4 side. The uppermost layer of the bonding pattern 5 is preferably made of a material that is melted at the time of bonding and mixed with the melted solder 7 to change the composition of the solder 7, so that a eutectic bonding layer with a melting point higher than the solder 7 can be formed. For example, when AuSn of the solder 7 is used, the uppermost layer of the bonding pattern 5 is preferably an Au layer.

Figure 9B:
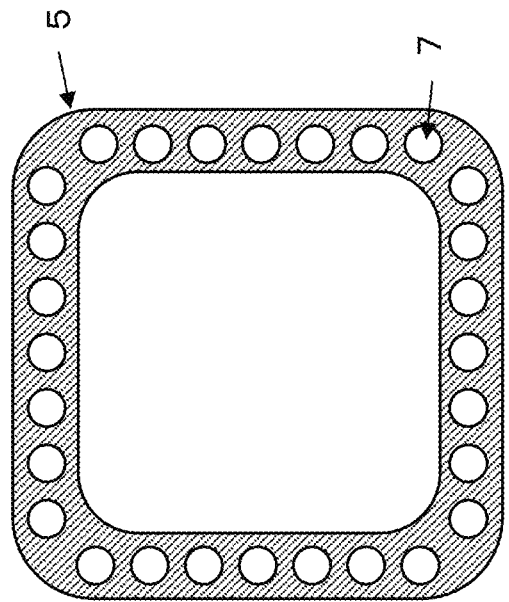
FIGS. 9(a) and 9(b) are bottom views illustrating states in which the solder 7 (before melting) is mounted on the bonding pattern 5 on a dome-shaped transparent body 4 side in a manufacturing process of the semiconductor light-emitting device according to Embodiment 1.
Figure 9A:
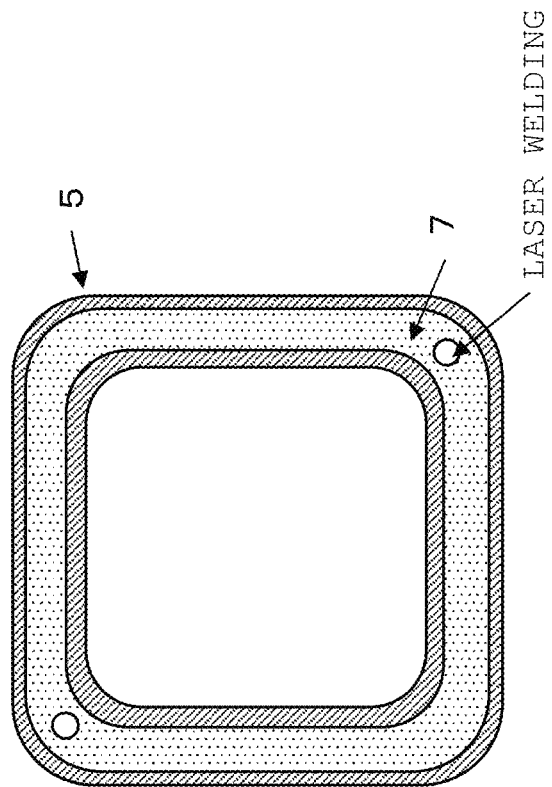

The solder 7 used for bonding adheres to the front surface of the bonding pattern 5 of the dome-shaped transparent body 4. The solder 7 for bonding is, for example, made of AuSn. The shape thereof may be the same as the shape of the bonding pattern 5 having the rectangular ring shape as illustrated in FIG. 9(a) and have a sheet shape in which the width is narrower than the bonding pattern 5 or may be dot-shaped solder as illustrated in FIG. 9(b).

The solder 7 having a sheet shape temporarily adheres to the bonding pattern 5 by partial laser welding. The melted solder 7 is scattered in a dot shape, and the dot-shaped solder 7 is welded to the bonding pattern 5. The diameter of the dot-shaped solder 7 is smaller than the width of the bonding pattern 5. The number of items of the dot-shaped solder 7 welded onto the bonding pattern 5 is preferably 20 to 36 and more preferably 28.

In both cases of the sheet shape and the dot shape, with respect to the composition ratio of Au and Sn of the AuSn solder 7, the Au concentration is preferably 73 wt % to 83 wt %, and the Au concentration is more preferably 78 wt %.

Then, the semiconductor light-emitting element 3 made of an AlGaN-based material, which emits ultraviolet light having a wavelength of 210 nm or more and 310 nm or less, is mounted to the electrode 2 of the substrate 1.

Then, the dome-shaped transparent body 4 is mounted on the substrate 1 so that the semiconductor light-emitting element 3 of the substrate 1 is covered, and is aligned so that the bonding pattern 5 and the bonding pattern 6 overlap with each other.

Then, a load is applied to the vertex of the dome-shaped transparent body 4, and the solder 7 is heated and melted while the dome-shaped transparent body 4 is pressed to the substrate 1.

Specifically, first, the substrate 1 on which the semiconductor light-emitting element is mounted and the dome-shaped transparent body 4 are set into a bonding device that can adjust filled gas. The dome-shaped transparent body 4 is set so that the opening faces upward, and the substrate is set above the dome-shaped transparent body 4 so that the side on which the semiconductor light-emitting element is mounted faces downward. Next, moisture is removed by heating the substrate 1 to the temperature that is slightly lower than the temperature at which the solder 7 is melted and causing the bonding device to be in a vacuum state. Thereafter, while the inside of the bonding device is replaced with nitrogen gas at atmospheric pressure, the top of the dome-shaped transparent body 4 is pushed up by a movable portion of the bonding device, and the dome-shaped transparent body 4 is pressed against the substrate 1 from below to seal the space 8. Next, the substrate 1 is heated to the melting temperature of the solder 7 and is cooled down after being maintained for a predetermined period of time, to form a bonding portion and airtightly seal the space 8.

Accordingly, as illustrated in FIG. 6(a), first, the solder 7 of the straight-line portions 52 and 62 of the bonding pattern 5 is melted and flows to the corner portions 51 and 61, and then the solder 7 of the corner portions 51 and 61 is melted. Thereafter, by cooling down, the bonding patterns 5 and 6 can be bonded to each other by the solder 7.

The solder 7 is melted, to form the bonding layer.

With the above, the semiconductor light-emitting device that emits ultraviolet light can be manufactured.

Since the corner portions of the bonding pattern 5 are disposed on the outer side of the base portion 4c to which a load is applied, the manufactured semiconductor light-emitting device can suppress the protrusion of the solder 7 into the space 8. In addition, the generation of the void can be prevented.

In addition, since an airtight space is formed by covering the semiconductor light-emitting element 3 with the dome-shaped transparent body 4 (quartz glass) having a curved surface on the front surface, total reflection is less likely to occur, and the light extraction efficiency increases.

Comparative Example 1

Figure 6B:
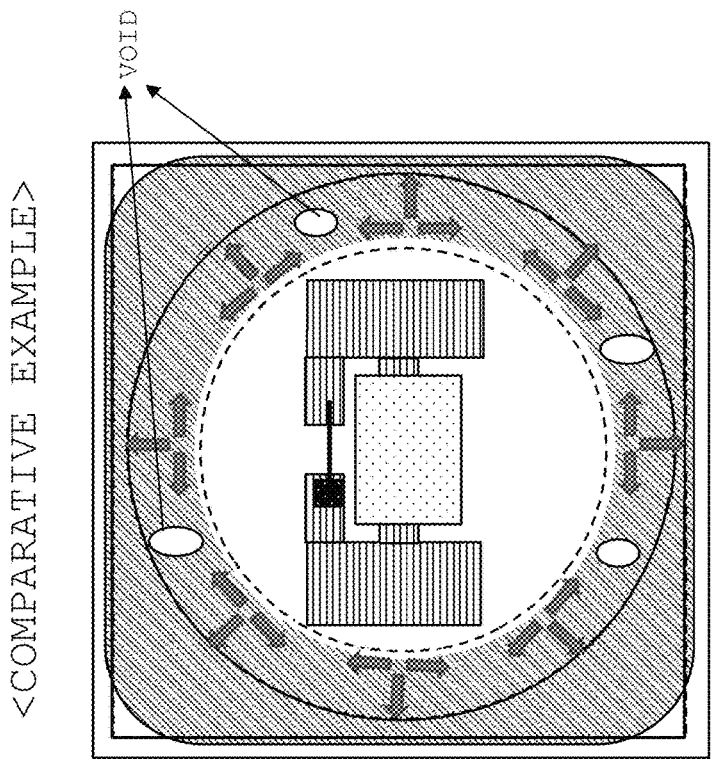
FIG. 6(b) is an explanatory view illustrating a flow of the melted solder 7 in a bonding process when a semiconductor light-emitting device according to a comparative example is manufactured.
Figure 6A:
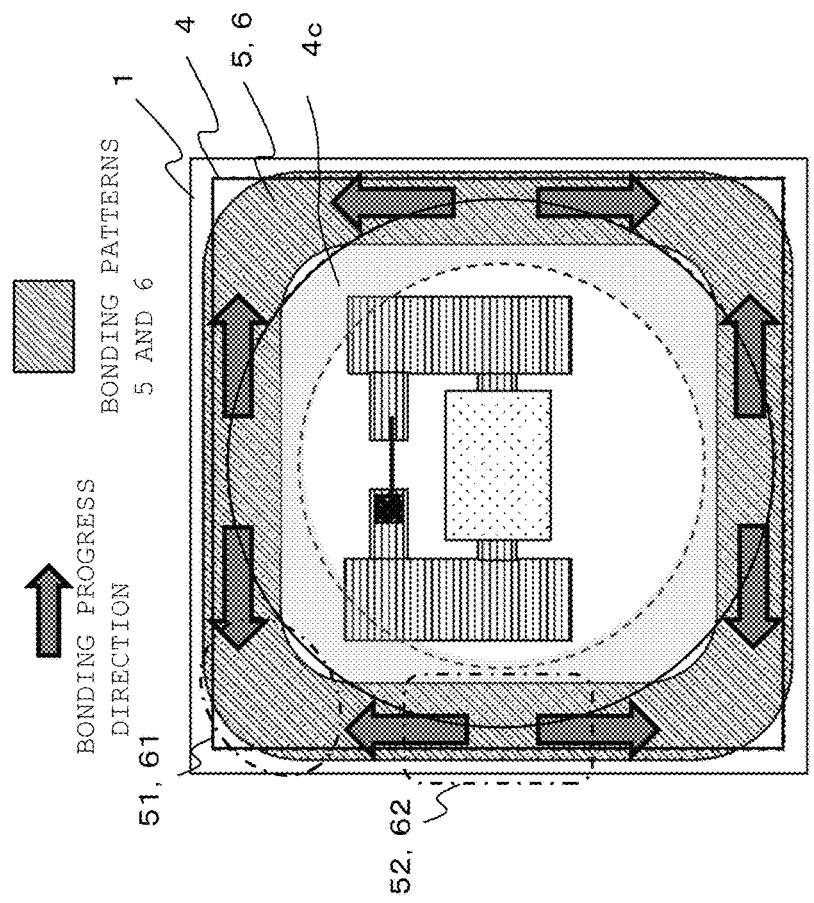
FIG. 6(a) is an explanatory view illustrating a flow of melted solder 7 in a bonding process when the semiconductor light-emitting device according to Embodiment 1 is manufactured.

As Comparative Example 1, FIG. 6(b) illustrates a method of progressing the melting of the solder 7 when the bonding patterns 5 and 6 are formed all over the base portion 4c and flange portion 4b.

With respect to the bonding patterns 5 and 6 in the comparative example, the outer shape is a rectangular ring shape, the edges 51a and 61a on the outer peripheral side have substantially rectangular shapes, and the edges 51b and 61b on the inner peripheral side have circular shapes. In the same manner as in Embodiment 1, with respect to the bonding patterns 5 and 6 in the comparative example, the edges 51a and 61a on the outer peripheral side are configured to be positioned on the outer side of the outer peripheral edge 41 of the annular base portion 4c of the convex lid portion 4a. However, differently from Embodiment 1, with respect to the bonding patterns 5 and 6 in the comparative example, the edges 51b and 61b on the inner peripheral side are positioned on the inner side of the outer peripheral edge 41 of the annular base portion 4c of the convex lid portion 4a over the entire circumference.

In this configuration of Comparative Example 1, as a result of X-ray transmission observation, bubbles are generated in the bonding layer 7a on the bonding patterns 5 and 6. The generation of the bubbles in the semiconductor light-emitting device according to Comparative Example 1 is more than the generation of the bubbles in the semiconductor light-emitting device according to Embodiment 1. In the X-ray transmission observation on a sample of the semiconductor light-emitting device according to Embodiment 1, the obvious generation of bubbles in the bonding layer 7a is not recognized. It is considered that this is because, in the semiconductor light-emitting device according to Comparative Example 1, melting starts from a plurality of positions of the base portion 4c to which loads are applied, bonding portions resultantly formed by progress of the bonding from many directions collide with each other, and the colliding position is the cause of the generation of the void. In addition, positions where the voids are generated are random. Therefore, it is concerned that voids that connect the space 8 inside the dome-shaped transparent body 4 to an outside space are generated.

Embodiment 2

Figures 10A, 10B:
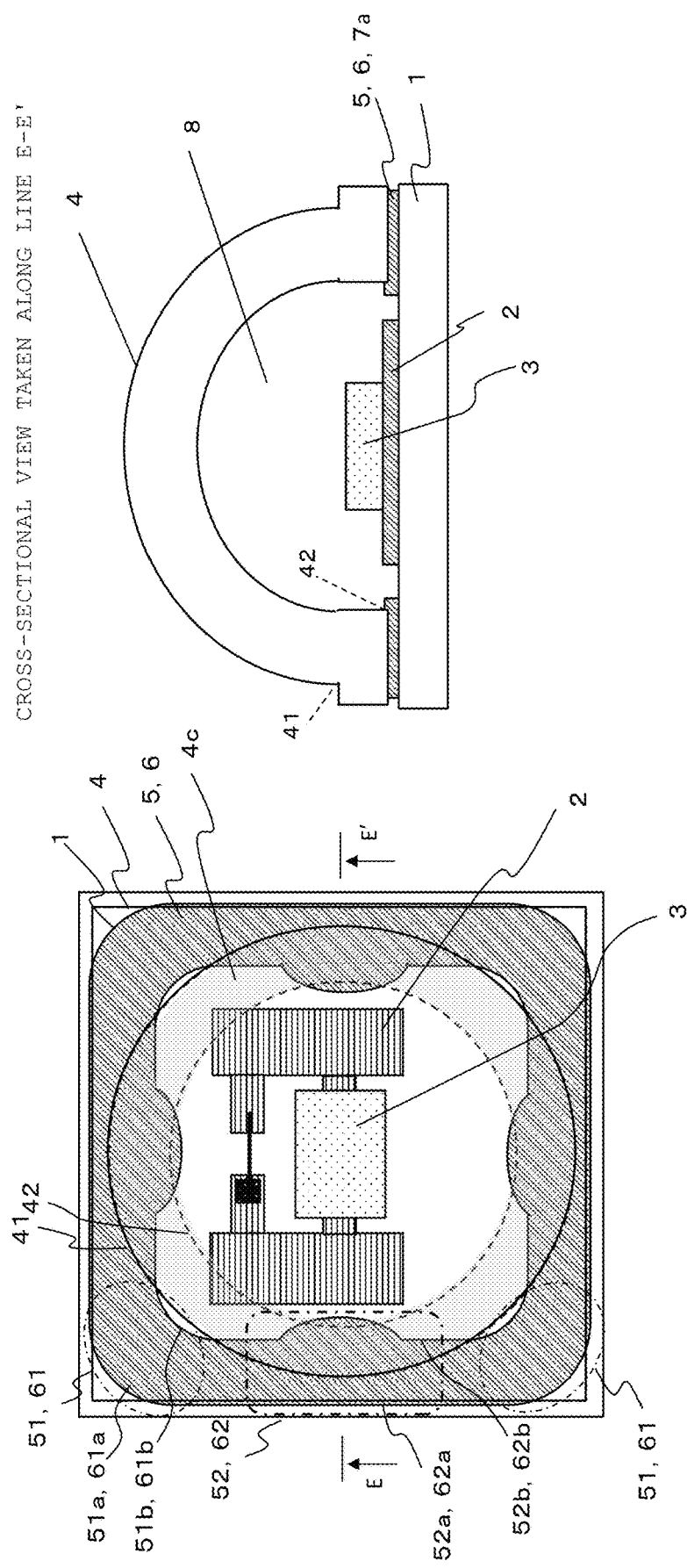
FIG. 10(a) is a top view of a semiconductor light-emitting device according to Embodiment 2.
FIG. 10(b) is a cross-sectional view thereof taken along the line E-E'.
Figure 11A:
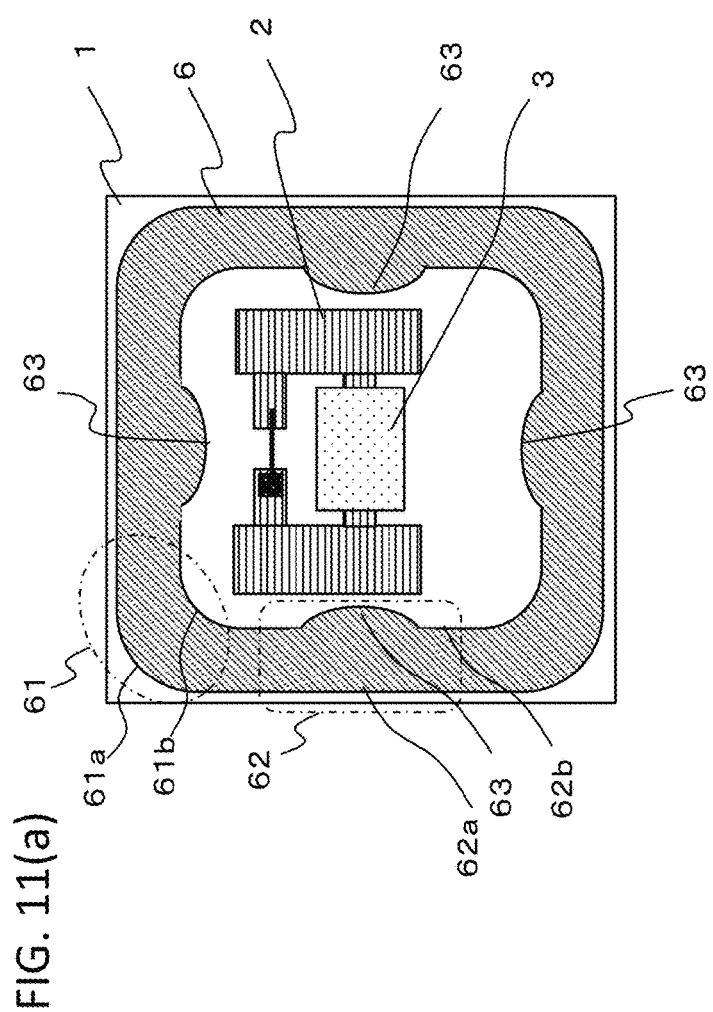
FIG. 11(a) is a top view of the substrate 1 of the semiconductor light-emitting device according to Embodiment 2.
Figure 11B:
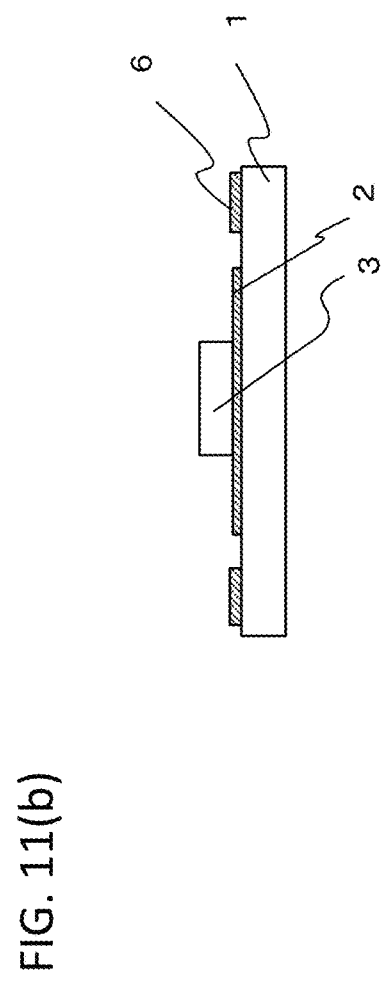
FIG. 11(b) is a cross-sectional view thereof.

A semiconductor light-emitting device according to Embodiment 2 is described with reference to FIG. 10 to FIG. 14. FIGS. 10(a) and 10(b) are a top view and a cross-sectional view of a semiconductor light-emitting device according to Embodiment 2. FIGS. 11(a) and 11(b) are a top view and a cross-sectional view of the substrate 1 of the semiconductor light-emitting device according to Embodiment 2.

Figure 12A:
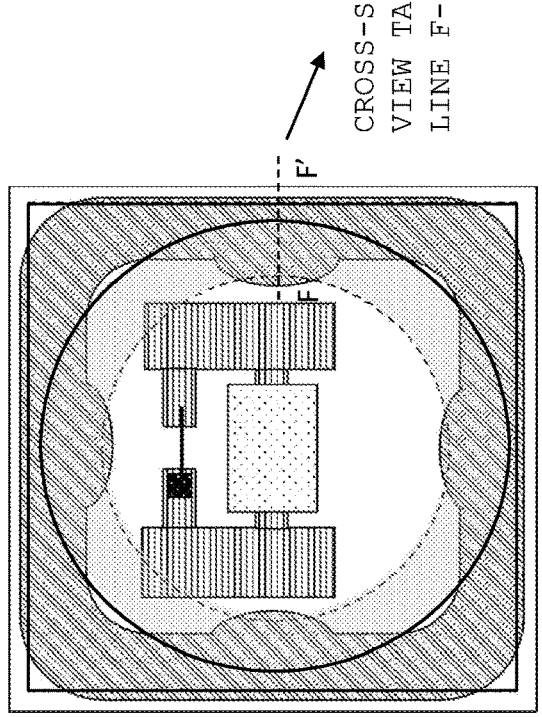
FIG. 12(a) is a top view of the semiconductor light-emitting device according to Embodiment 2.
Figure 12B:
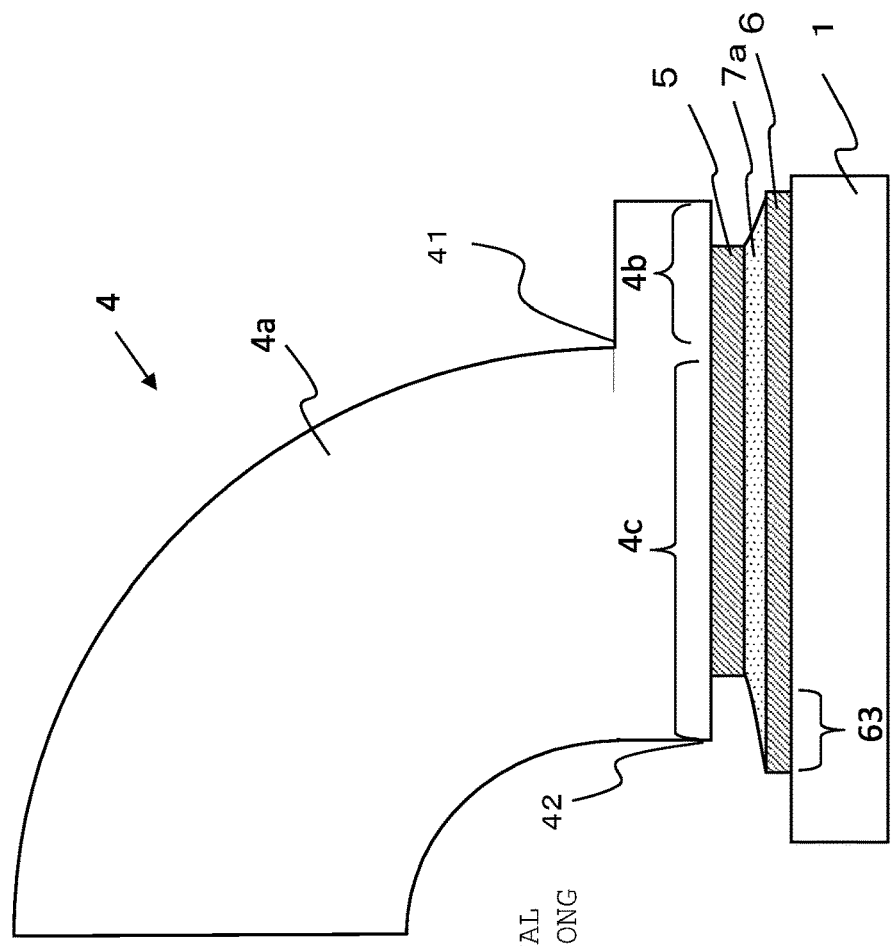
FIG. 12(b) is a cross-sectional view thereof taken along the line F-F'.

As illustrated in FIG. 10, FIG. 11, and FIG. 12, the semiconductor light-emitting device according to Embodiment 2 has the same configuration as the device of Embodiment 1, but is different from Embodiment 1 in that convex portions 63 that project to the semiconductor light-emitting element 3 side are provided in the edges 62b on the inner peripheral sides of the straight-line portions 62 of the bonding pattern 6 on the substrate 1. The shape of the edge of the convex portions 63 is a substantially arc shape in the present embodiment. The positions where the convex portions 63 are provided are intermediate points between the corner portions 61. The convex portions 63 are provided at four positions.

As illustrated in FIGS. 10(a) and 10(b), and FIG. 12, the tips of the convex portions 63 of the bonding pattern 6 preferably project to the semiconductor light-emitting element 3 side from an inner peripheral edge 42 of the annular base portion 4c of the dome-shaped transparent body 4.

The shape of the bonding pattern 5 of the dome-shaped transparent body 4 is the same as in Embodiment 1 (see FIG. 5). That is, the bonding pattern 5 on the dome-shaped transparent body 4 side does not have a convex portion shape corresponding to the convex portions 63 of the bonding pattern 5 on the substrate 1 side.

Figure 13:
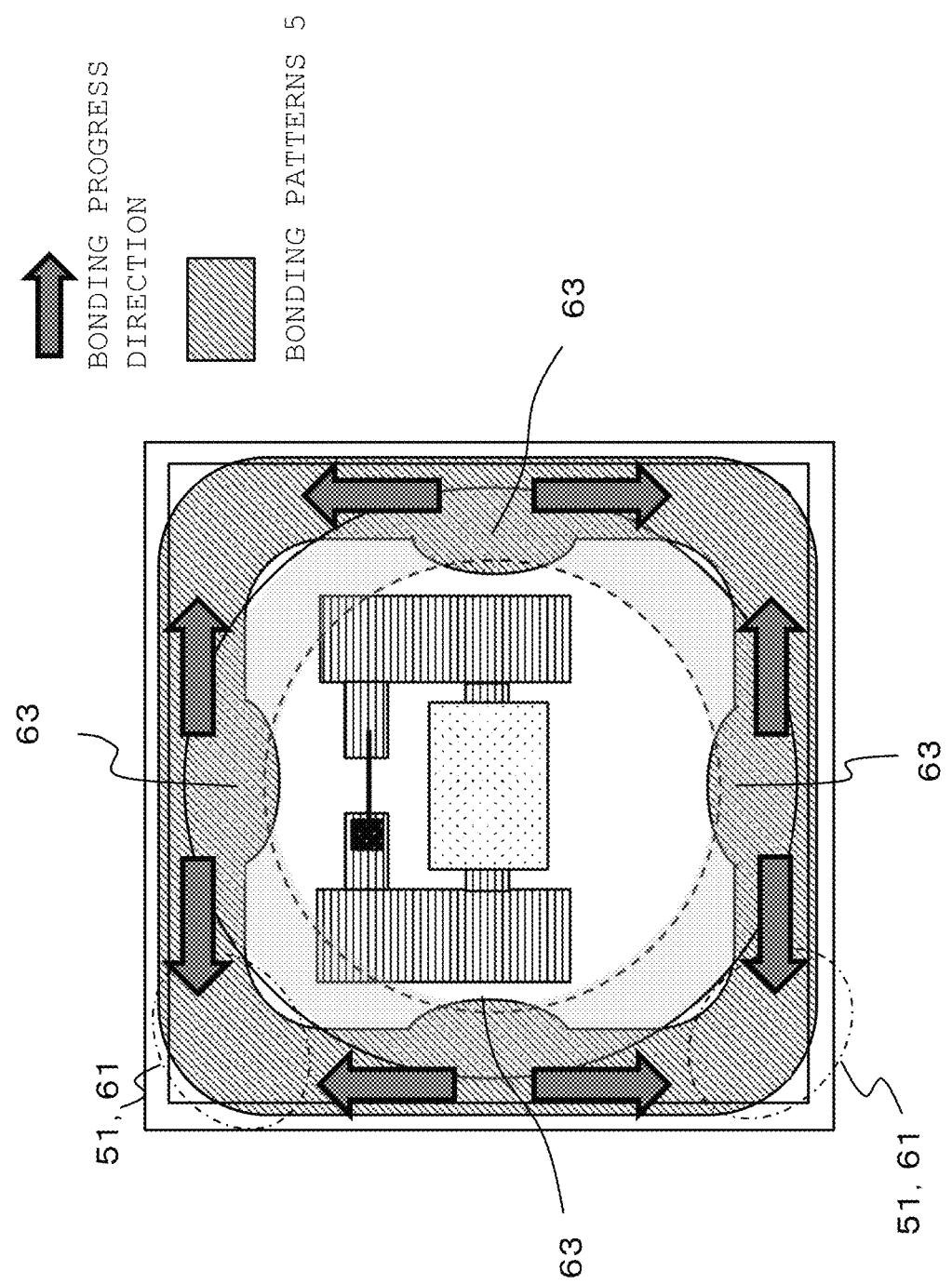
FIG. 13 is an explanatory view illustrating a flow of the melted solder 7 in a bonding process when the semiconductor light-emitting device according to Embodiment 2 is manufactured.

Since the bonding pattern 6 made of metal includes the wide convex portions 63, when the substrate 1 is heated in the manufacturing process of bonding the dome-shaped transparent body 4, the temperature of the convex portions 63 is higher than that of the surroundings. Also, parts of the bonding patterns 5 and 6 of the straight-line portions 62 that are adjacent to the convex portions 63 overlap with the base portion 4c of the dome-shaped transparent body 4 and thus are pressed by the base portion 4c at the time of bonding, so that the solder 7 is first melted. Therefore, melting start positions are fixed to the bonding patterns 5 and 6 of the straight-line portions 62 adjacent to the convex portions 63, and thus the flow of the melted solder directed from the straight-line portions 62 to the corner portions 61 as illustrated in FIG. 13 can be generated more clearly than in Embodiment 1, so that a settled bonding layer can be formed. In addition, flows of melted solder collide with each other at fewer locations, and the generation of voids can be suppressed. Accordingly, the generation of voids that connect the space 8 inside the dome-shaped transparent body 4 to an outside space can be suppressed.

In addition, the semiconductor light-emitting device according to Embodiment 2 can suppress the generation of solder balls more than the semiconductor light-emitting device according to Embodiment 1.

Here, in the semiconductor light-emitting device according to Embodiment 1, it is required to sufficiently supply the solder 7 to form the bonding layer 7a, but when the amount of the solder 7 is too much, the excess solder 7 protrudes from the bonding patterns 5 and 6 as illustrated in FIG. 7 but does not wet the front surface of the substrate 1, so that a solder ball 71 that hardens into a ball shape is likely formed. The solder ball 71 may protrude into the space 8 and become visible to cause a poor appearance and may reach the electrode 2 on the substrate 1 to cause a decrease in reliability, such as a non-lighting of the light-emitting element. Particularly, the protrusion of the solder ball 71 into the space 8 is more likely to occur on the cross section taken along line C-C' as illustrated in FIG. 7(a) than on the cross section taken along line D-D'.

Figure 14:
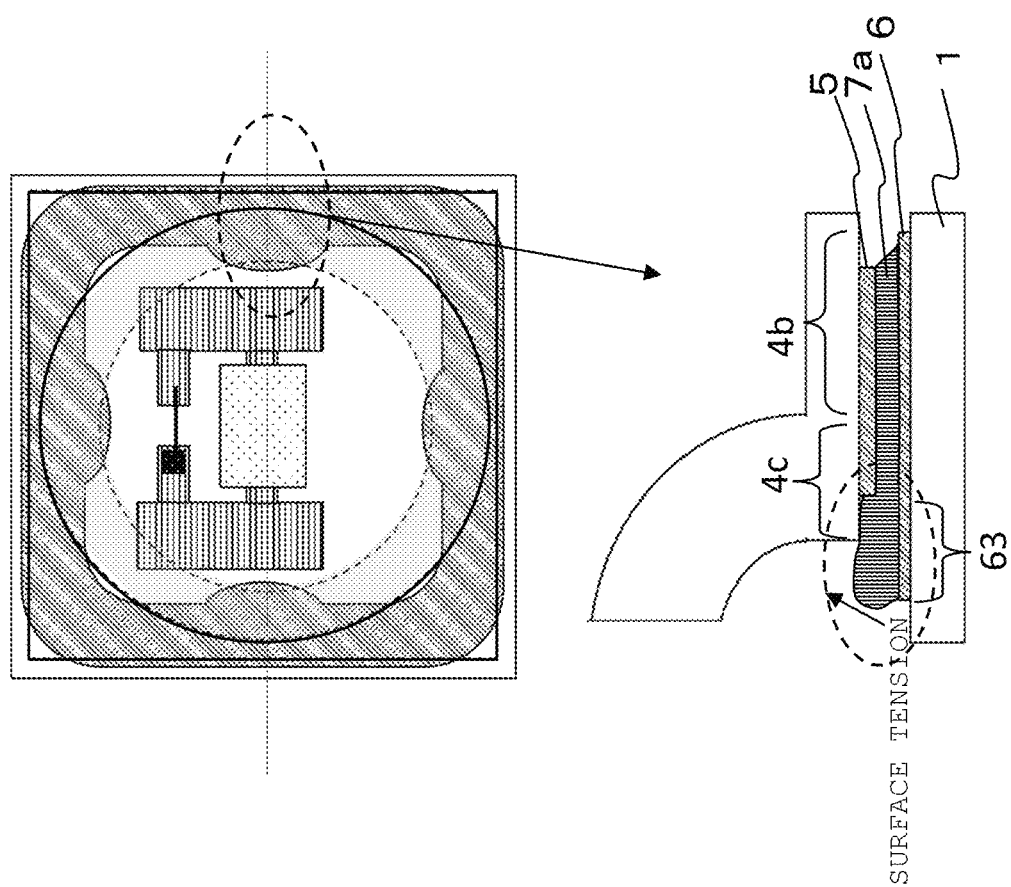
FIG. 14 is a cross-sectional view of a state in which the solder 7 wets and spreads to a bonding pattern in the semiconductor light-emitting device according to Embodiment 2.

In contrast, in the semiconductor light-emitting device according to Embodiment 2, even when the amount of solder 7 is large, as illustrated in FIG. 14, the solder wets and spreads to the convex portions 63 and thus can be maintained by surface tension, so that it is possible to suppress protrusion of the solder 7 from the bonding pattern 6 to form solder balls. That is, it is possible to increase the degree of freedom in designing the solder 7 to form the bonding layer 7a with high reliability.

Accordingly, it is possible to prevent a solder ball from being in contact with the electrode 2 to cause a short circuit, and thus the occurrence of defects can be suppressed.

Other configurations, functions and effects of the device of Embodiment 2 are the same as those of Embodiment 1, so description thereof is omitted.

Modification 1 of Embodiment 2

Figure 15A:
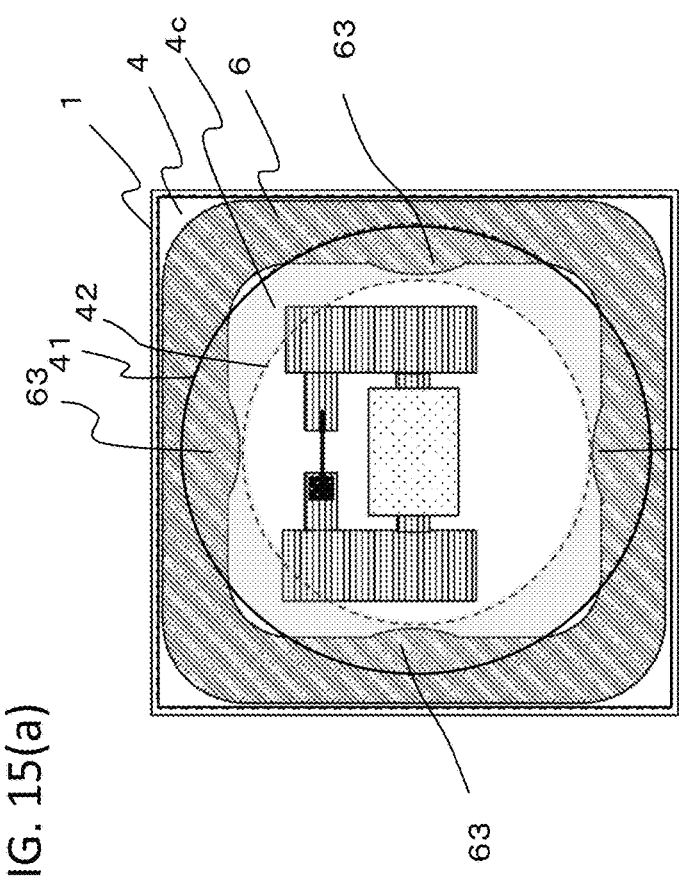
FIG. 15(a) is a top view of a semiconductor light-emitting device according to Modification 1 of Embodiment 2.
Figure 15B:
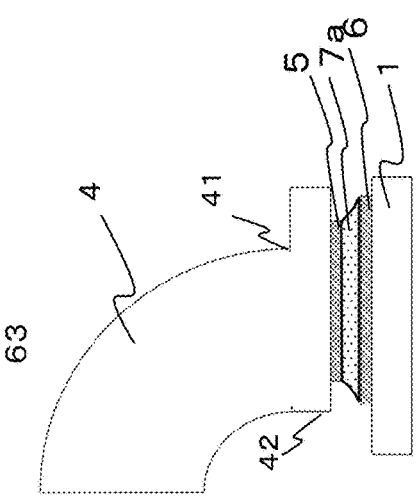
FIG. 15(b) is a cross-sectional view thereof.

FIGS. 15(a) and 15(b) illustrate a top view and a cross-sectional view of the semiconductor light-emitting device according to Modification 1 of Embodiment 2. In the configuration of Embodiment 2 illustrated in FIGS. 10(*a*) and 10(*b*), the tips of the convex portions 63 project to the semiconductor light-emitting element 3 side from the edge 42 on the inner side of the base portion 4*c* of the dome-shaped transparent body 4. However, as in the device of Modification 1 illustrated in FIGS. 15(*a*) and 15(*b*), the tips of the convex portions 63 may be positioned on the outer side of the edge 42 on the inner side of the base portion 4*c*.

Modification 2 of Embodiment 2

Figure 16A:
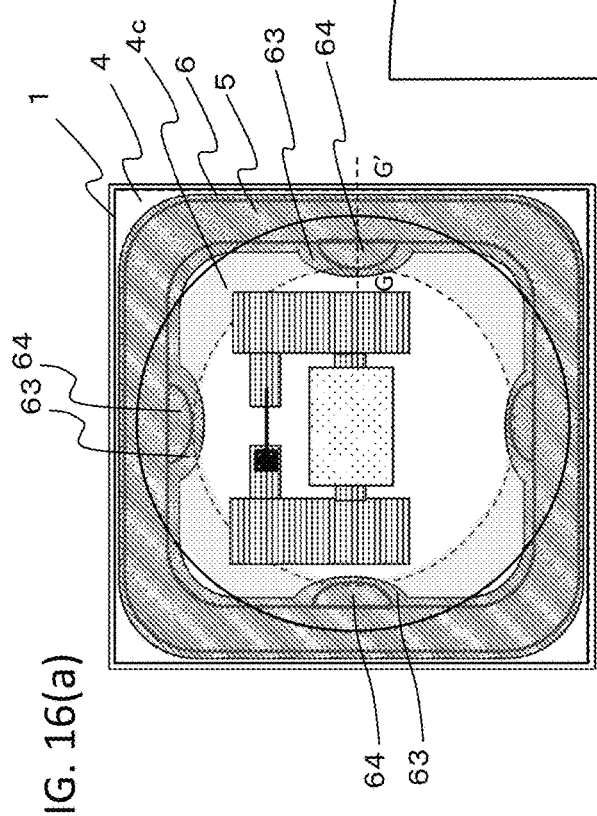
FIG. 16(a) is a top view of a semiconductor light-emitting device according to Modification 2 of Embodiment 2.
Figure 16B:
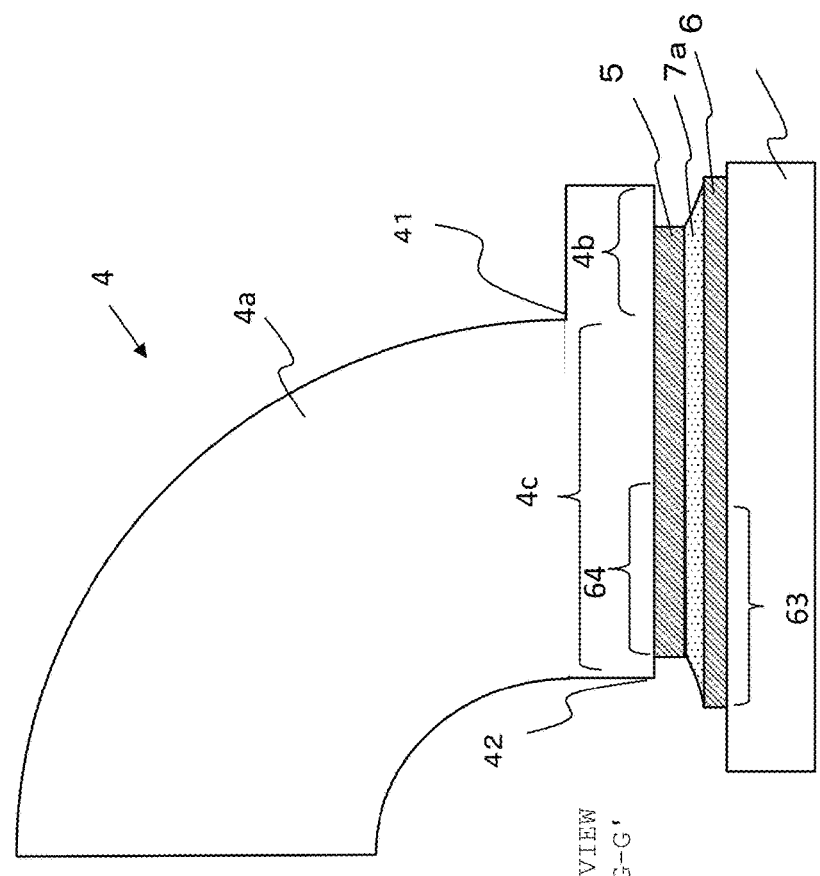
FIG. 16(b) is a cross-sectional view thereof.

A top view and a cross-sectional view of the semiconductor light-emitting device according to Modification 2 of Embodiment 2 are illustrated in FIGS. 16(*a*) and 16(*b*). In the configuration of Embodiment 2 illustrated in FIGS. 10(*a*) and 10(*b*), the convex portions 63 are provided in the bonding pattern 6 on the substrate 1 side, but a convex portion is not provided in the bonding pattern 5 of the dome-shaped transparent body 4. As in Modification 2 illustrated in FIGS. 16(*a*) and 16(*b*), convex portions 64 may also be provided in the bonding pattern 5 of the dome-shaped transparent body 4. The convex portions 64 are provided at positions facing the convex portions 63.

In addition, in Embodiments 1 and 2, and Modifications 1 and 2, the shape of the convex lid portion 4*a* of the dome-shaped transparent body 4 may be a shape in which the inside space 8 is convex with respect to the substrate 1. Therefore, in the convex lid portion 4*a*, the space 8 may have a hemispherical shape and may have a semi-ellipsoidal shape.

In addition, an outer shape of the convex lid portion 4*a* is not limited to a hemispherical shape or a semi-ellipsoidal shape, and may be any shape. For example, the outer shape of the convex lid portion 4*a* may be a rectangular parallelepiped shape.

Further, the base portion 4*c* of the convex lid portion 4*a* is not limited to a circular shape and may have an oval shape.

Embodiment 3

As Embodiment 3, a water disinfection device using the semiconductor light-emitting devices according to Embodiments 1 and 2 and Modifications 1 and 2 is described.

In the water disinfection device, a semiconductor light-emitting device and a drive circuit thereof are disposed in a supply channel for supplying water. The semiconductor light-emitting device irradiates water flowing through the supply channel with deep ultraviolet light for disinfection.

In addition, the semiconductor light-emitting devices of Embodiments 1 and 2 and Modifications 1 and 2 can be used as an LED package that seals a deep-ultraviolet LED as the semiconductor light-emitting element 3. In addition, the semiconductor light-emitting devices can be used as a laser package that seals a surface emitting laser as the semiconductor light-emitting element.

REFERENCE SIGNS LIST

1: substrate
2: electrode
3: semiconductor light-emitting element
4: dome-shaped transparent body
4*a*: convex lid portion
4*b*: flange portion
4*c*: base portion
5, 6: bonding pattern
7: solder
8: space
41: outer peripheral edge of base portion
42: inner peripheral edge of base portion
51, 61: corner portion of bonding pattern
52, 62: straight-line portion of bonding pattern
63, 64: convex portion

The invention claimed is:

1. A semiconductor light-emitting device comprising:
   a substrate;
   a semiconductor light-emitting element that is mounted on the substrate; and
   a dome-shaped transparent body that is mounted on the substrate,
   wherein:
   the dome-shaped transparent body includes a convex lid portion that covers a space around the semiconductor light-emitting element and includes an annular base portion and a flange portion that projects to an outer side of an outer peripheral edge of the annular base portion,
   a first bonding pattern made of metal that surrounds the semiconductor light-emitting element is formed on the substrate,
   a second bonding pattern having a shape corresponding to the first bonding pattern is provided in the base portion and the flange portion of the dome-shaped transparent body,
   the first bonding pattern and the second bonding pattern are bonded to each other via solder, to seal the space in the convex lid portion, and
   the first bonding pattern and the second bonding pattern have rectangular ring shapes that surround the semiconductor light-emitting element when viewed from above, at least edges on inner peripheral sides of corner portions thereof are positioned on outer sides of outer peripheral edges of the annular base portion of the convex lid portion, and at least edges on inner peripheral sides of straight-line portions sandwiched between the corner portions are positioned closer to the semiconductor light-emitting element than the outer peripheral edge of the annular base portion of the convex lid portion.

2. The semiconductor light-emitting device according to claim 1, wherein the base portion has an annular shape.

3. The semiconductor light-emitting device according to claim 1, wherein a width of the second bonding pattern is narrower than a width of the first bonding pattern.

4. The semiconductor light-emitting device according to claim 1, wherein a convex portion that projects to the semiconductor light-emitting element side is provided at an edge on the inner peripheral side at an intermediate point between corner portions of the straight-line portion of the first bonding pattern.

5. The semiconductor light-emitting device according to claim 4, wherein a tip of the convex portion of the first bonding pattern projects to the semiconductor light-emitting element side from an inner peripheral edge of the annular base portion of the convex lid portion.

6. The semiconductor light-emitting device according to claim 4, wherein the second bonding pattern does not include a convex portion corresponding to the convex portion of the first bonding pattern.

7. The semiconductor light-emitting device according to claim 1, wherein:
   an outer shape of the flange portion of the dome-shaped transparent body is a rectangular shape, and the first bonding pattern and the second bonding pattern are provided along the outer shape of the flange portion.

8. The semiconductor light-emitting device according to claim 1, wherein the first bonding pattern is formed with any metal among Ni, Cr, Au, Cu, Pt, Ti, Pd, and W, or a stacked body of layers made of two or more kinds of metal among the Ni, Cr, Au, Cu, Pt, Ti, Pd, and W.

9. The semiconductor light-emitting device according to claim 1, wherein the solder is an AuSn solder.

10. The semiconductor light-emitting device according to claim 1, wherein a convex lid portion of the dome-shaped transparent body is configured with a material that transmits deep ultraviolet rays.

11. The semiconductor light-emitting device according to claim 1, wherein the semiconductor light-emitting element emits ultraviolet light having a wavelength band of 210 nm or more and 310 nm or less.

12. The semiconductor light-emitting device according to claim 1, wherein the semiconductor light-emitting element is a surface emitting laser.

13. A water disinfection device comprising:
a light-emitting device that is disposed in a supply channel that supplies water, and irradiates water flowing through the supply channel with deep ultraviolet light; and
a drive circuit of the light-emitting device,
wherein the semiconductor light-emitting device according to claim 1 is used as the light-emitting device.

* * * * *